United States Patent
Ozawa

(10) Patent No.: US 8,755,211 B2
(45) Date of Patent: Jun. 17, 2014

(54) SEMICONDUCTOR MEMORY DEVICE

(75) Inventor: Susumu Ozawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 13/401,113

(22) Filed: Feb. 21, 2012

(65) Prior Publication Data

US 2012/0218836 A1    Aug. 30, 2012

(30) Foreign Application Priority Data

Feb. 21, 2011    (JP) .................................. 2011-035065

(51) Int. Cl.
*G11C 5/02*    (2006.01)

(52) U.S. Cl.
CPC ...................................... *G11C 5/025* (2013.01)
USPC .............................................. 365/51; 365/63

(58) Field of Classification Search
CPC ...... G11C 5/025; G11C 11/16; H01L 27/115; H01L 27/11521
USPC ........................................ 365/51, 63, 185.17
See application file for complete search history.

(56) References Cited

U.S. PATENT DOCUMENTS

| | | | | |
|---|---|---|---|---|
| 5,650,975 | A   * | 7/1997  | Hamade et al. | 365/230.01 |
| 6,707,706 | B2  * | 3/2004  | Nitayama et al. | 365/149 |
| 7,859,902 | B2    | 12/2010 | Maejima | |
| 2007/0121359 | A1 * | 5/2007  | Kanda | 365/51 |
| 2010/0207195 | A1 | 8/2010 | Fukuzumi et al. | |

FOREIGN PATENT DOCUMENTS

JP            2009-146954            7/2009

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a semiconductor memory device comprises a first silicon pillar including a first pair of columnar portions and a first connection portion, a second silicon pillar including a second pair of columnar portions and a second connection portion in the shunt region, the second silicon pillar being adjacent to the first silicon pillar, a first interconnection connected to one of the first pair of columnar portions of the first silicon pillar, a second interconnection connected to one of the second pair of columnar portions of the second silicon pillar. The first interconnection is connected to a dummy bit line. The first interconnection and the second interconnection are connected on the same level.

17 Claims, 13 Drawing Sheets

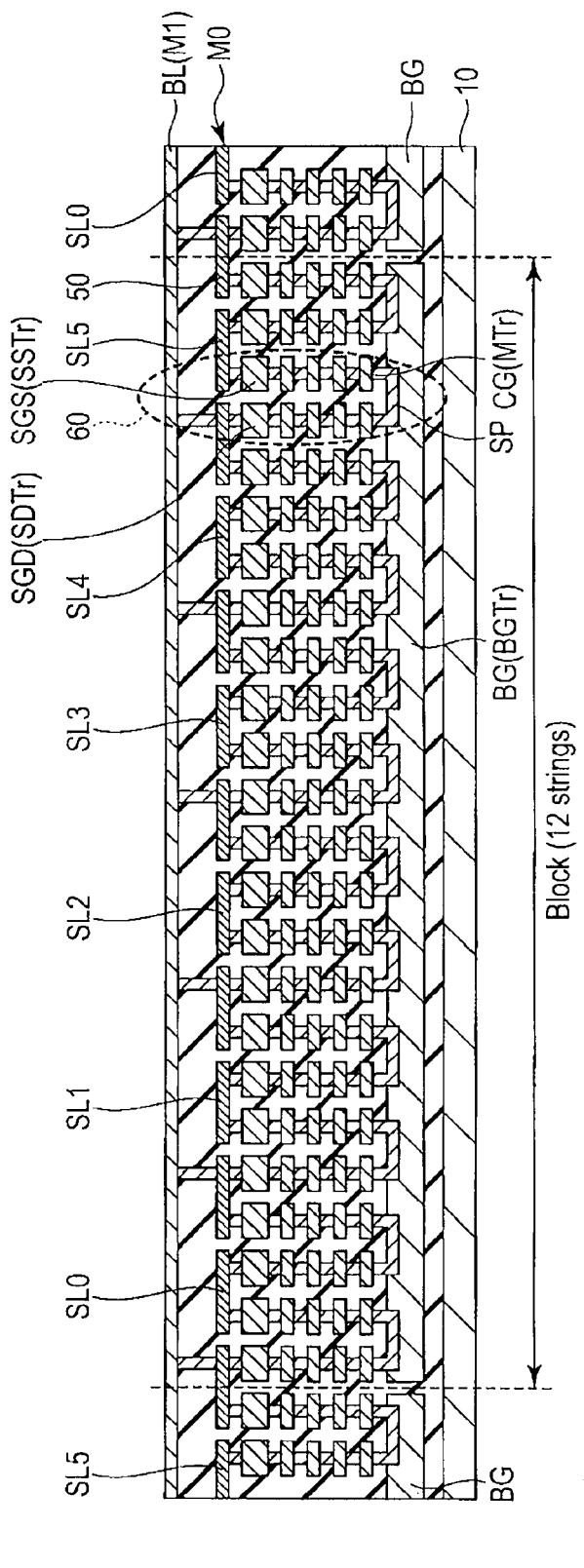
F I G. 6

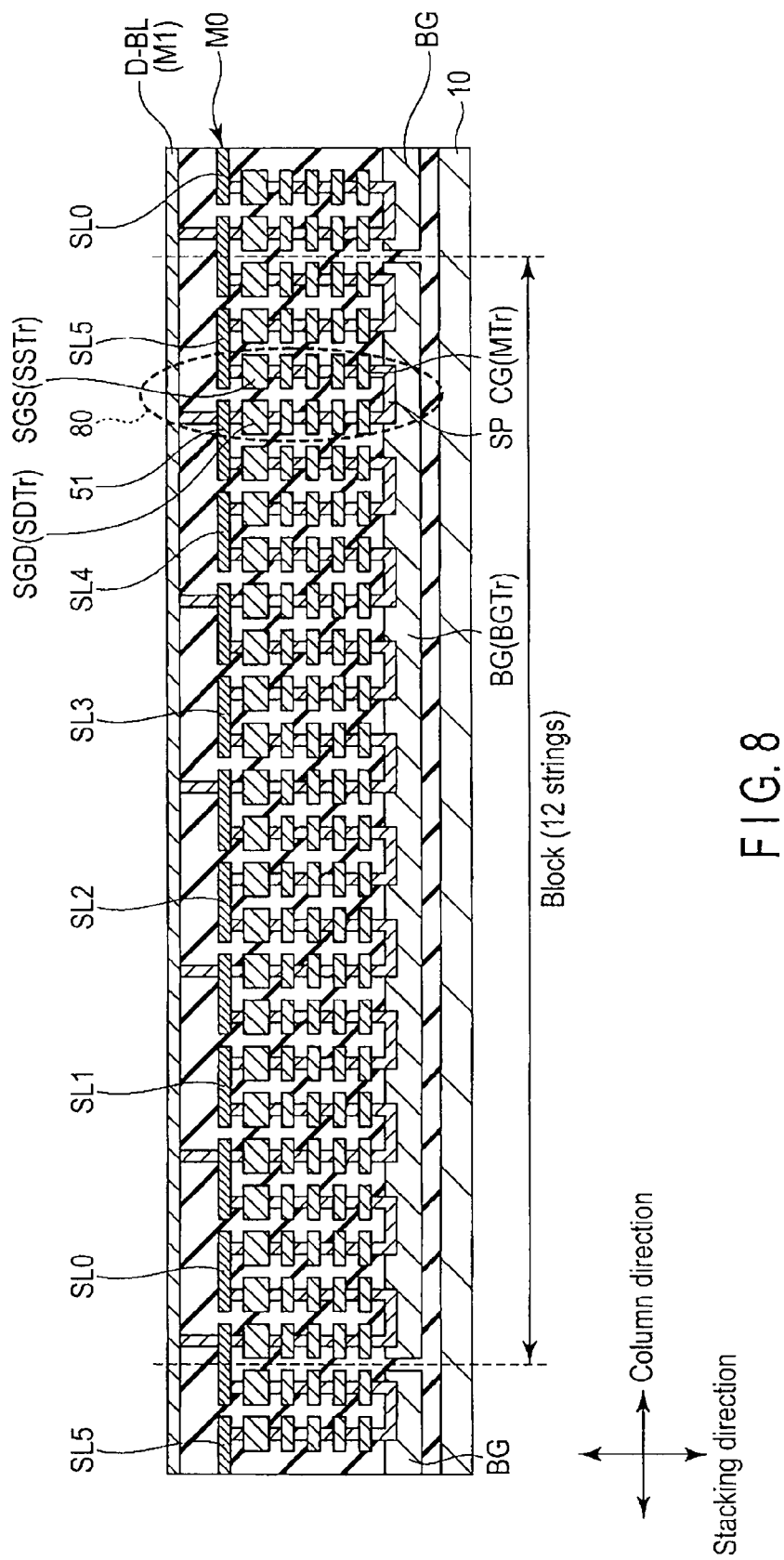
F I G. 8

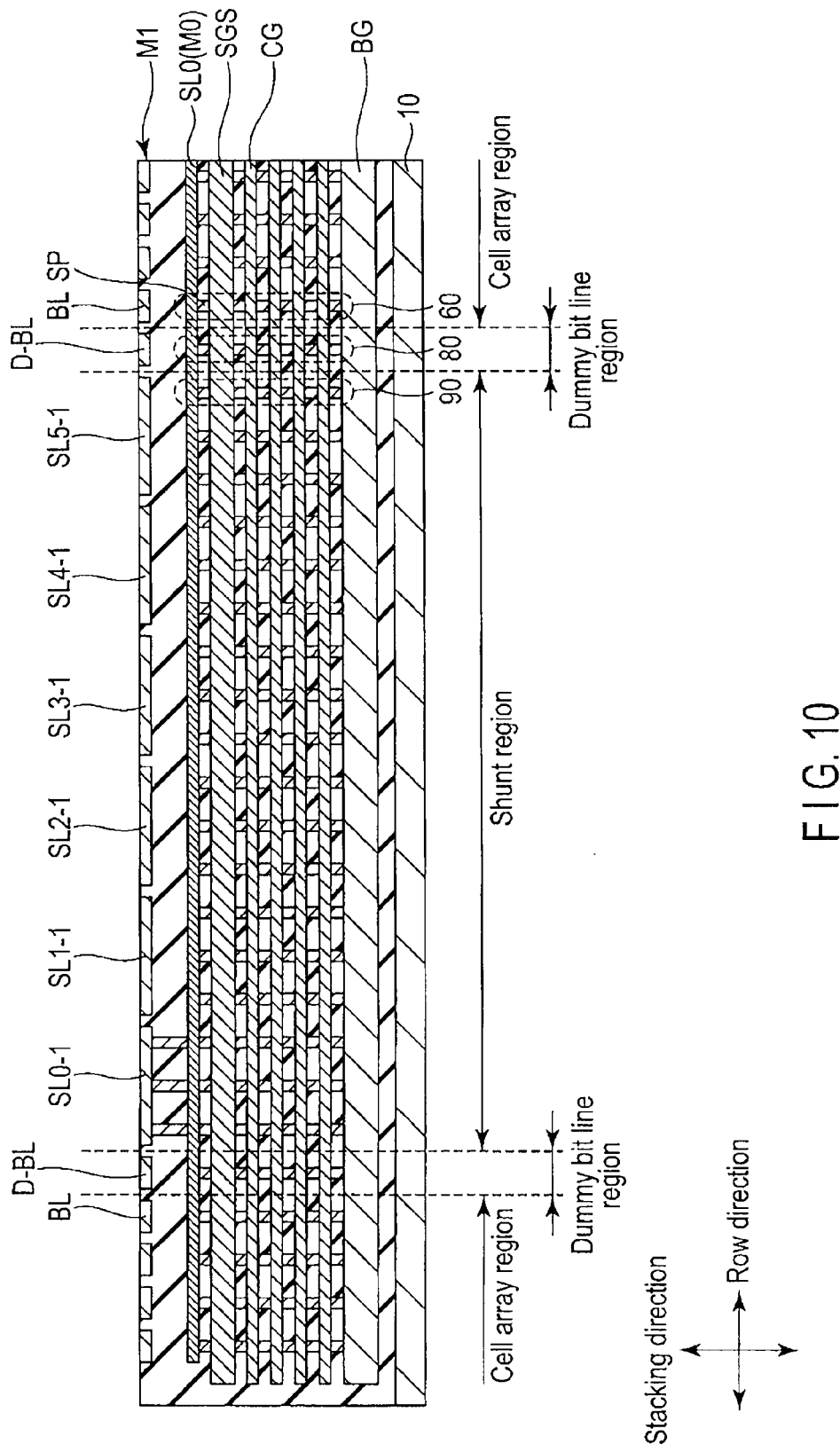
F I G. 10

US 8,755,211 B2

SEMICONDUCTOR MEMORY DEVICE

CROSS-REFERENCE TO RELATED APPLICATIONS

This application is based upon and claims the benefit of priority from prior Japanese Patent Application No. 2011-035065, filed Feb. 21, 2011, the entire contents of which are incorporated herein by reference.

FIELD

Embodiments described herein relate generally to a semiconductor memory device.

BACKGROUND

In a conventional LSI, the elements are integrated in the two-dimensional plane on a silicon substrate. However, the storage capacity of a memory can be increased only by downsizing (micropatterning) each element. Recently, however, the micropatterning has also become difficult in terms of cost and technique.

To solve the above-described problem, there has been proposed an idea for three-dimensionally stacking memory layers and batch-processing them to manufacture a three-dimensionally stacked memory. In addition, as the collectively-processed-type three-dimensionally stacked memory (bit cost scalable (BiCS)), a pipe-type NAND flash memory (p-BiCS) has been proposed in which U-shaped memory strings are formed in the stacking direction. In the pipe-type NAND flash memory, one memory string is formed by a pair of silicon pillars and a pipe that connects them at the lower end. More specifically, memory cell transistors are arranged at the intersections between the silicon pillars and a plurality of stacked word lines. Additionally, select transistors are arranged at the intersections between each of a pair of silicon pillars and two select gates. One of the two select transistors is connected to a bit line, and the other is connected to a source line.

BRIEF DESCRIPTION OF THE DRAWINGS

FIG. 6 is a sectional view taken along line VI-VI in FIGS. 4 and 5;

FIG. 8 is a sectional view taken along line VIII-VIII in FIGS. 4 and 5;

FIG. 10 is a sectional view taken along line X-X in FIGS. 4 and 5;

DETAILED DESCRIPTION

Figure 1:
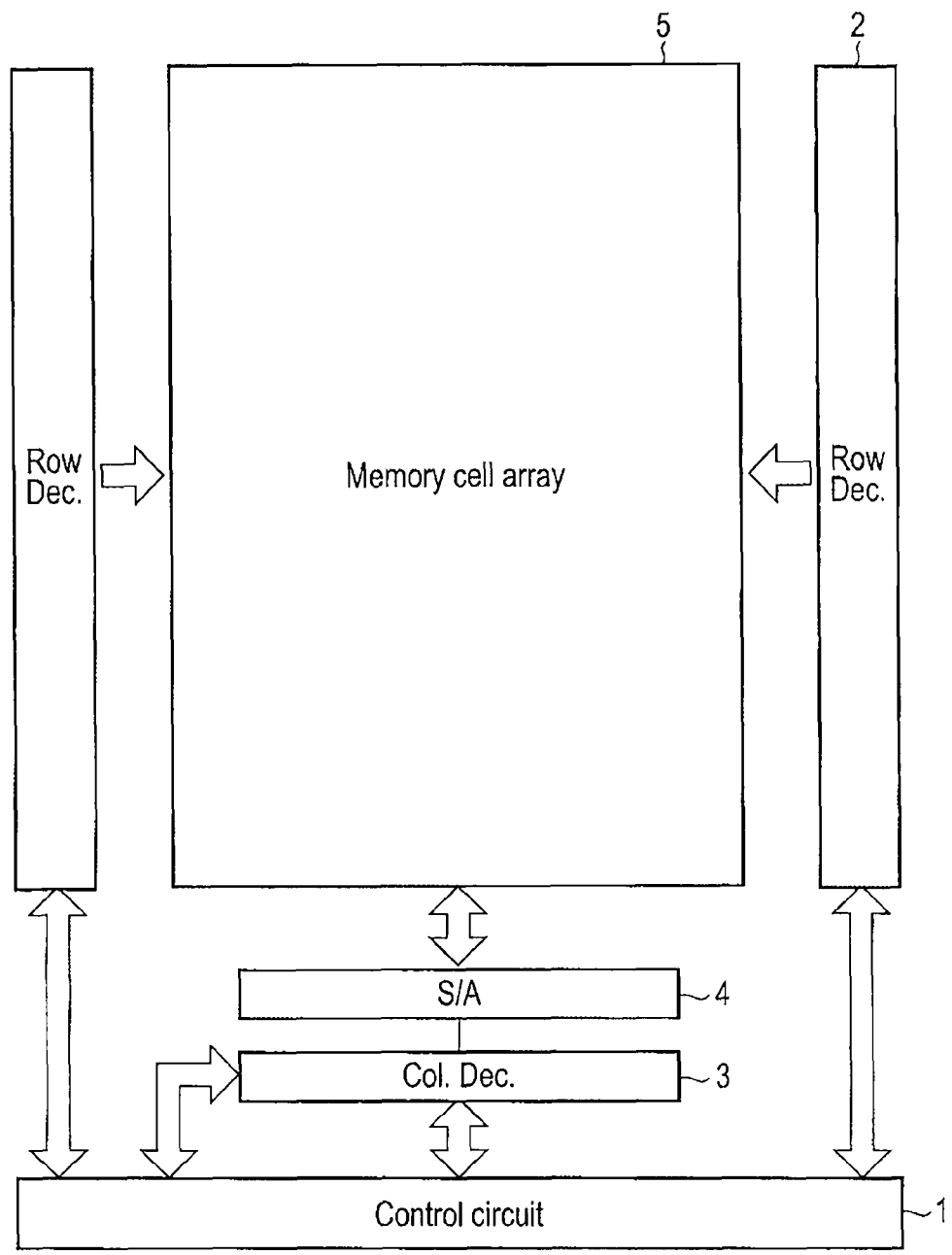
FIG. 1 is a block diagram showing an example of the overall arrangement of a semiconductor memory device according to the embodiment.

In general, according to one embodiment, a semiconductor memory device comprises: a first cell array region; a second cell array region arranged in a row direction; a shunt region arranged between the first cell array region and the second cell array region; a first dummy bit line region arranged between the first cell array region and the shunt region; a second dummy bit line region arranged between the second cell array region and the shunt region; a first silicon pillar including a first pair of columnar portions and a first connection portion in the first dummy bit line region, each of the first columnar portions extending vertically with respect to a semiconductor substrate, the first connection portion connecting lower ends of the first pair of columnar portions; a second silicon pillar including a second pair of columnar portions and a second connection portion in the shunt region, each of the second columnar portions extending vertically with respect to the semiconductor substrate, the second connection portion connecting lower ends of the second pair of columnar portions, the second silicon pillar being adjacent to the first silicon pillar in the row direction; a source line connected to one of the pair of columnar portions of each of the first silicon pillar and the second silicon pillar; a first interconnection connected to the other of the first pair of columnar portions of the first silicon pillar, the first interconnection formed above the first silicon pillar on the same level as that of the source line; a second interconnection connected to the other of the second pair of columnar portions of the second silicon pillar, the second interconnection formed above the second silicon pillar on the same level as that of the source line; and a first dummy bit line connected to the first interconnection, the first dummy bit line formed above the first interconnection. The first interconnection and the second interconnection are connected on the same level.

The embodiment will now be described with reference to the accompanying drawing. The same reference numerals denote the same parts throughout the drawing.

<Example of Overall Arrangement>

An example of the overall arrangement of a semiconductor memory device (p-BiCS) according to the embodiment will be described below with reference to FIGS. 1 and 2.

FIG. 1 is a block diagram showing an example of the overall arrangement of the semiconductor memory device according to the embodiment.

As shown in FIG. 1, the semiconductor memory device comprises a control circuit 1, a row decoder 2, a column decoder 3, a sense amplifier 4, and a memory cell array 5.

The control circuit 1 is configured to generate voltages to be applied to memory cells in the memory cell array 5 in write, erase, and read, and control the row decoder 2, the column decoder 3, and the sense amplifier 4 in accordance with an externally supplied address.

The row decoder 2 is configured to select a word line WL under the control of the control circuit 1.

The column decoder 3 is configured to select a bit line BL via the sense amplifier 4 under the control of the control circuit 1.

The memory cell array 5 comprises a plurality of blocks. Each of the plurality of blocks comprises a plurality of word lines WL and bit lines BL and a plurality of memory strings arranged in a matrix.

The sense amplifier 4 is configured to amplify data read out from a memory cell to the bit line BL for each page under the control of the column decoder 3. Note that the sense amplifier 4 may be integrated with the column decoder 3.

Figure 2:
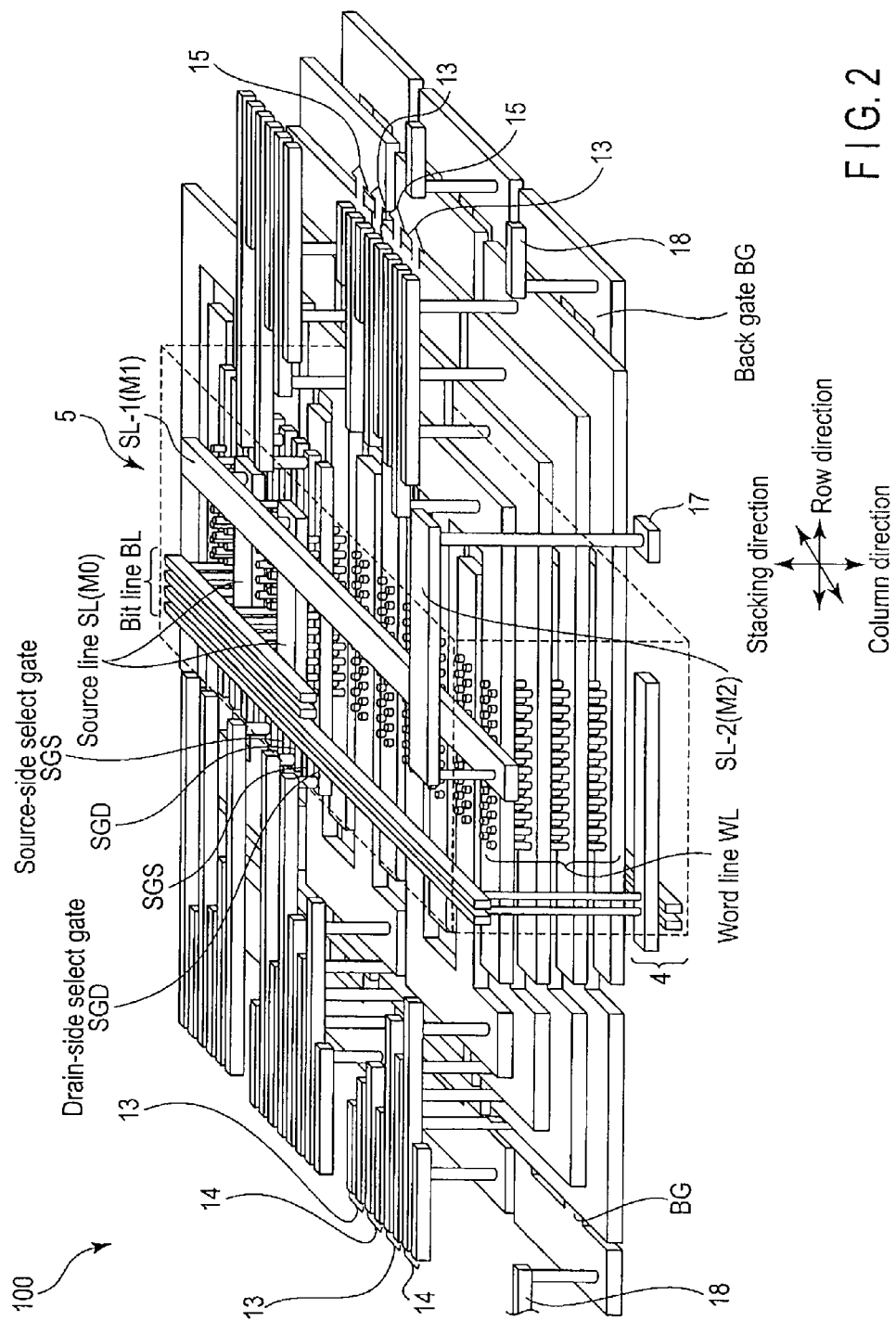
FIG. 2 is a perspective view showing an example of the schematic arrangement of the semiconductor memory device according to the embodiment.

FIG. 2 is a perspective view showing an example of the schematic arrangement of the semiconductor memory device according to the embodiment.

As shown in FIG. 2, a semiconductor memory device 100 comprises the memory cell array 5, a plurality of word line driving circuits 13, a plurality of source-side select gate driving circuits 14, a plurality of drain-side select gate driving circuits 15, the sense amplifier 4, a plurality of source line driving circuits 17, and a plurality of back gate transistor driving circuits 18.

The memory cell array 5 includes a plurality of word lines WL, a plurality of bit lines BL, a plurality of source lines SL, a plurality of back gates BG, a plurality of source-side select gates SGS, and a plurality of drain-side select gates SGD. In the memory cell array 5, memory cell transistors MTr for storing data are arranged at the intersections between the plurality of stacked word lines WL and U-shaped silicon pillars SP to be described later. Note that although FIG. 2 illustrates an example in which four layers of word lines WL are stacked, the present embodiment is not limited to this.

The word line driving circuits 13 are connected to the word lines WL to control the voltages to be applied to the word lines WL. All interconnections for connecting the word line driving circuits 13 and the word lines WL are formed in the interconnection layer of the same level. Instead, the interconnections may be formed in interconnection layers of different levels.

The source-side select gate driving circuits 14 are connected to the source-side select gates SGS to control the voltages to be applied to the source-side select gates SGS.

The drain-side select gate driving circuits 15 are connected to the drain-side select gates SGD to control the voltages to be applied to the drain-side select gates SGD.

The sense amplifier 4 is connected to the bit lines BL to amplify the potential read from the memory cell transistors MTr. Bit line driving circuits (not shown) control the voltages to be applied to the bit lines BL.

The source line driving circuits 17 are connected to the source lines SL via source interconnections SL-2 (M2) and SL-1 (M1) to control the voltages to be applied to the source lines SL. The source line driving circuits 17 are connected to all source lines SL. However, the present embodiment is not limited to this, and each source line SL may be provided with one source line driving circuit.

The back gate driving circuits 18 are connected to the back gates BG to control the voltages to be applied to the back gates BG.

These driving circuits are controlled by the control circuit 1 shown in FIG. 1.

In the above-described BiCS structure, the following problems arise.

In the p-BiCS structure, since the storage capacity per unit area is large, the erase unit problematically becomes large. To solve this, source interconnections of several systems functioning as a power supply are provided for the source lines SL, thereby actually dividing the erase unit. The source interconnections are led from the upper interconnection layer M2 (source interconnections SL-2) to the middle interconnection layer M1 (source interconnections SL-1) and then from the middle interconnection layer M1 to a lower interconnection layer M0 (source lines SL).

Source interconnections SL-1 of the middle interconnection layer M1 are on the same level as that of the bit lines BL and are formed along the same direction (column direction) as that of the bit lines BL. For this reason, the source interconnections (SL0-1 to SL5-1 to be described later) of the several systems exist in the region (shunt region) between the bit lines BL. That is, no bit lines can be arranged in the shunt region. All cells in that region exist as dummy cells in the floating state. Bit lines adjacent to the shunt region exist as dummy bit lines that do not operate for fear of the influence of coupling by the source interconnections.

When the number of source interconnections increases, the shunt region becomes large. When the number of shunt regions increases, the number of dummy bit lines increases. Hence, the area penalty undesirably increases.

In this embodiment, however, the cells (dummy cells) in the shunt regions and the dummy bit line regions are effectively used as ROM fuses and the like to store management data (for example, voltage data and threshold data) in the write, thereby apparently increasing the storage capacity.

<First Embodiment>

A semiconductor memory device according to the first embodiment will be described below with reference to FIGS. 3, 4, 5, 6, 7, 8, 9, 10, and 11.

Figure 3:
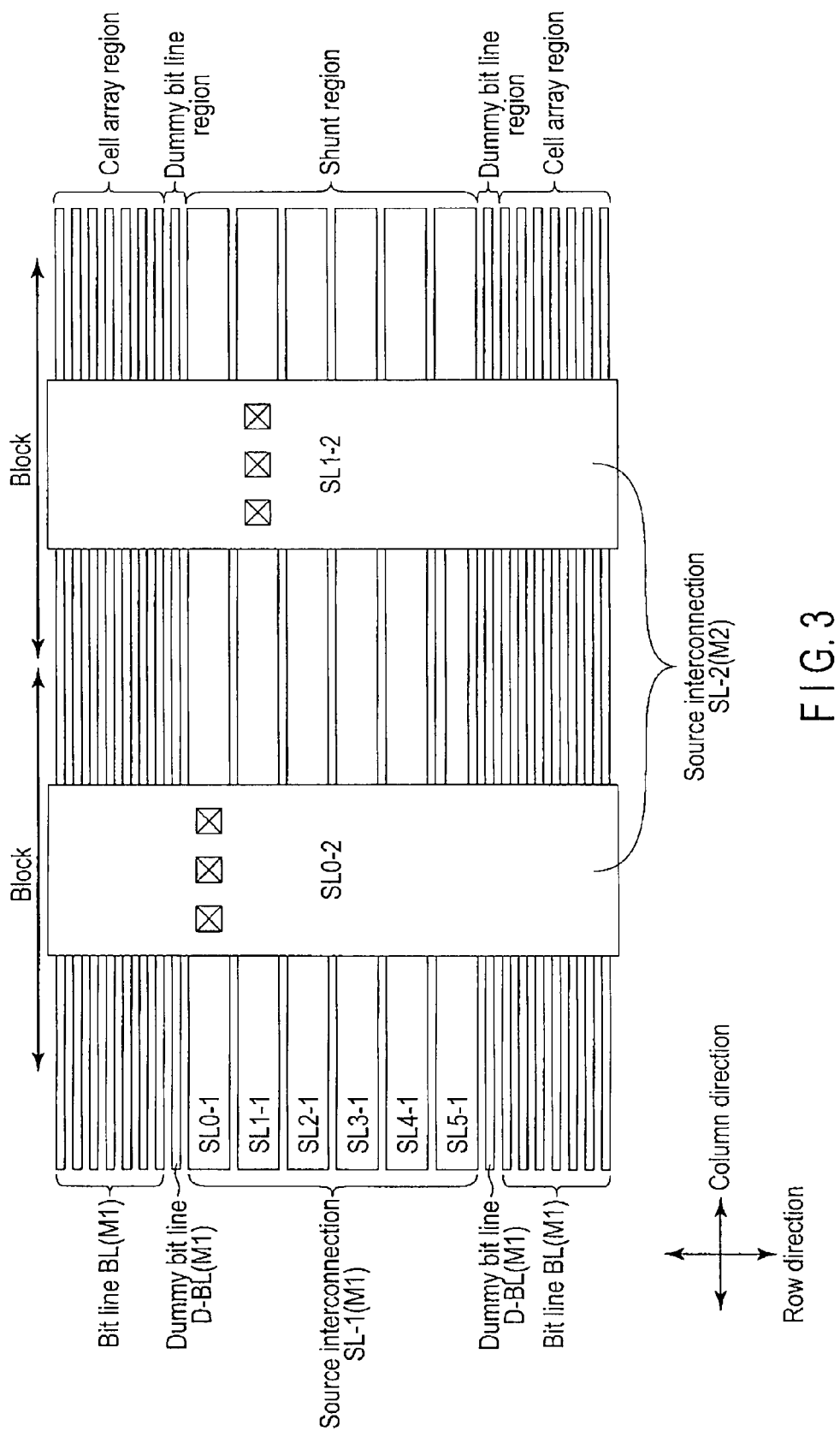
FIG. 3 is a plan view showing the memory cell array of a semiconductor memory device according to the first embodiment.
Figure 4:
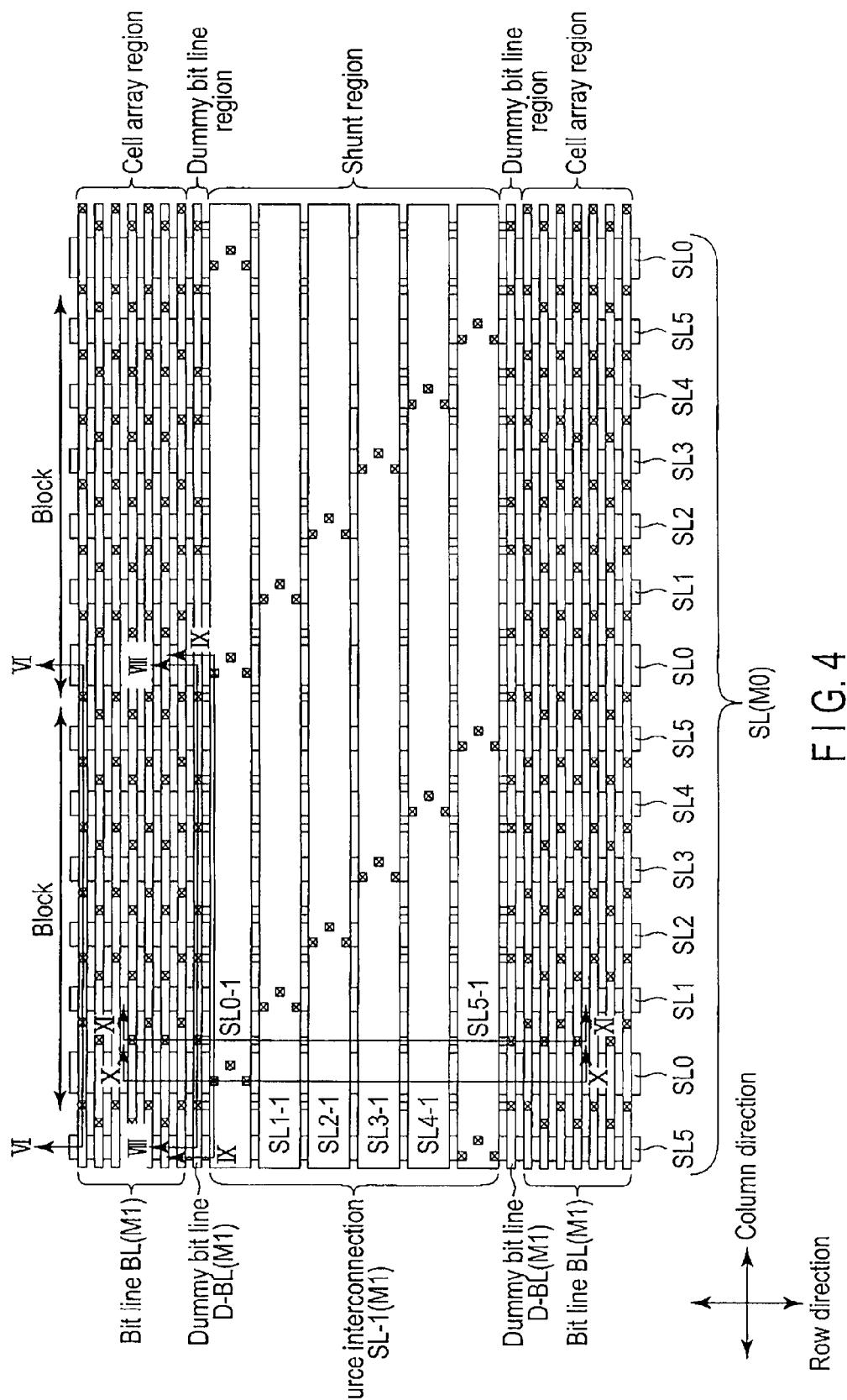
FIG. 4 is a plan view showing the memory cell array of the semiconductor memory device according to the first embodiment.
Figure 5:
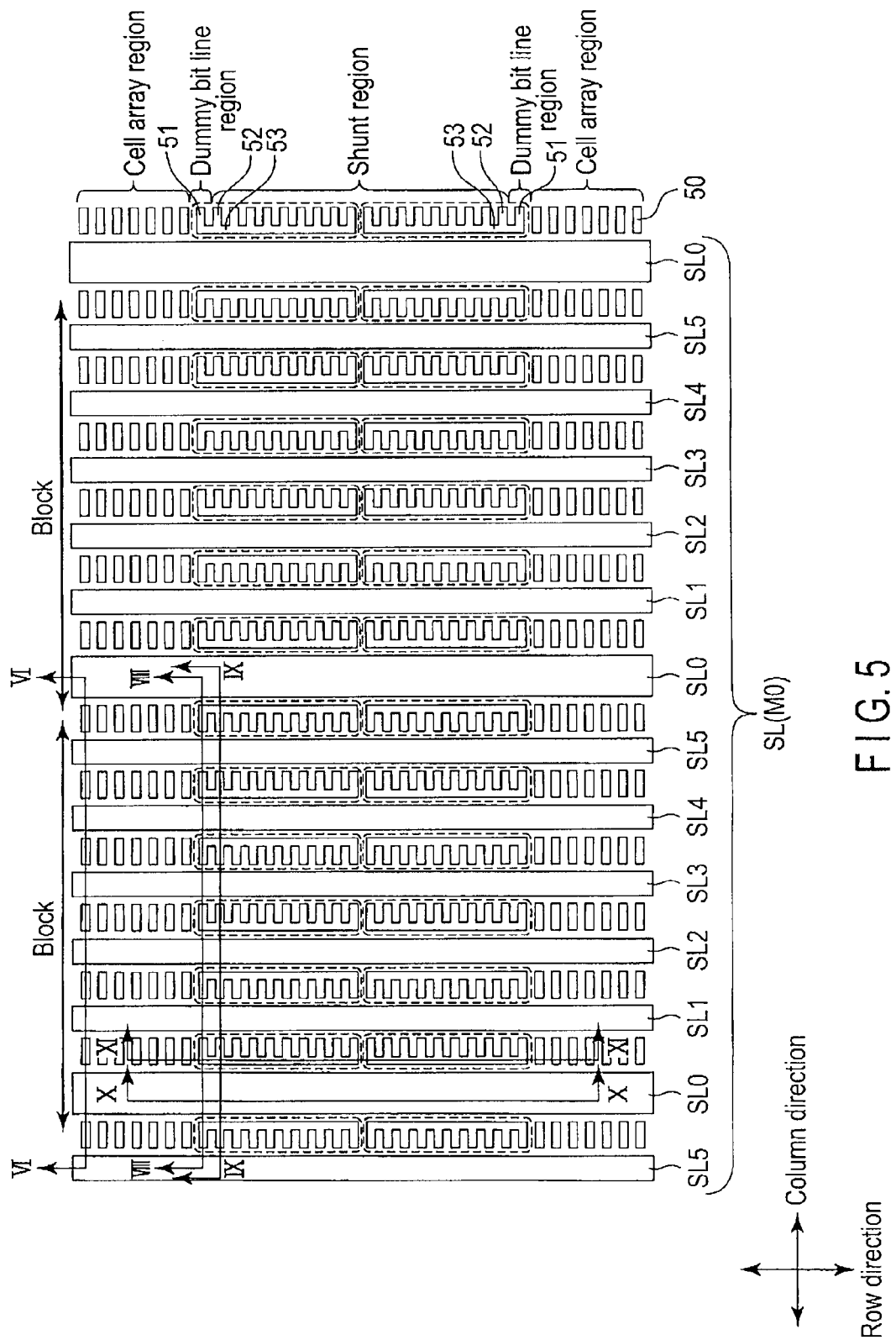
FIG. 5 is a plan view showing the memory cell array of the semiconductor memory device according to the first embodiment.

FIGS. 3, 4, and 5 are plan views showing a memory cell array 5 of the semiconductor memory device according to the first embodiment. More specifically, FIG. 3 is a plan view showing an upper interconnection layer M2 and a middle interconnection layer M1. FIG. 4 is a plan view showing the middle interconnection layer M1 and a lower interconnection layer M0. FIG. 5 is a plan view showing the lower interconnection layer M0. FIGS. 3, 4, and 5 illustrate a region corresponding to two blocks.

As shown in FIG. 3, the memory cell array 5 includes a plurality of cell array regions, a plurality of shunt regions, and a plurality of dummy bit line regions. FIG. 3 illustrates two cell array regions (first cell array region and second cell array region) adjacent in the row direction, a shunt region located between the first cell array region and the second cell array region, a first dummy bit line region located between the first cell array region and the shunt region, and a second dummy bit line region located between the second cell array region and the shunt region.

A plurality of bit lines BL of interconnection layer M1 are formed in each cell array region. The plurality of bit lines BL extend in the column direction while being arranged parallel to each other.

The shunt region is located between the two cell array regions adjacent in the row direction. A plurality of source interconnections SL-1 of interconnection layer M1 are formed in the shunt region. In other words, source interconnections SL-1 are formed on the same level as that of the bit lines BL. In this example, six systems of source interconnections SL1-1 to SL5-1 are formed. Source interconnections SL1-1 to SL5-1 extend in the column direction while being arranged parallel to each other and parallel to the bit lines BL.

Each dummy bit line region is located between a cell array region and the shunt region. A dummy bit line D-BL of interconnection layer M1 is formed in each dummy bit line region. In other words, the dummy bit lines D-BL are formed on the same level as that of the bit lines BL and source interconnections SL-1. The dummy bit lines D-BL have the same structure as that of the bit lines BL and are arranged parallel to the bit lines BL and source interconnections SL-1. The dummy bit lines D-BL are formed adjacent to the bit lines BL and source interconnections SL-1 in the row direction.

Note that the dummy bit lines D-BL of this embodiment have the same function as that of the bit lines BL. That is, a control circuit 1 can apply an appropriate voltage to the dummy bit lines D-BL in the write, erase, and read operations.

Source interconnections SL-1 are connected, via contacts, to source interconnections SL-2 of interconnection layer M2 located above interconnection layer M1. More specifically, source interconnection SL0-1 of interconnection layer M1 is connected to a source interconnection SL0-2 of interconnection layer M2. Source interconnection SL1-1 of interconnection layer M1 is connected to a source interconnection SL1-2 of interconnection layer M2. Source interconnections SL2-1 to SL5-1 are also connected to source interconnections (not shown) of interconnection layer M2, respectively. Source interconnections SL-2 of interconnection layer M2 extend in the row direction. In other words, source interconnections SL-1 and SL-2 intersect at right angles.

As shown in FIG. 4, source interconnections SL-1 are connected, via contacts, to source lines SL of interconnection layer M0 located under interconnection layer M1. More specifically, source interconnections SL0-1 to SL5-1 of interconnection layer M1 are connected to source lines SL0 to SL5 of interconnection layer M0, respectively. The source lines SL of interconnection layer M0 extend in the row direction. In other words, source interconnections SL-1 and the source lines SL intersect at right angles.

The bit lines BL are connected, via contacts, to interconnections 50 (to be described later) of interconnection layer M0 located under interconnection layer M1. The dummy bit lines D-BL are connected, via contacts, to interconnections 51 (to be described later) of interconnection layer M0.

As shown in FIG. 5, the plurality of interconnections 50 of interconnection layer M0 are formed in the cell array regions and arranged between the source lines SL in the column direction. The plurality of interconnections 50 are arranged under the bit lines BL and formed with a line-and-space configuration in the row direction.

Interconnections 51 of interconnection layer M0 are formed in the dummy bit line regions and arranged between the source lines SL in the column direction. The plurality of interconnections 51 are arranged under the dummy bit lines D-BL.

A plurality of interconnections 52 of interconnection layer M0 are formed in the shunt region and arranged between the source lines SL in the column direction. The plurality of interconnections 52 are formed with a line-and-space configuration in the row direction.

Interconnections 50 in the cell array regions, interconnections 51 in the dummy bit line regions, and interconnections 52 in the shunt region are formed in parallel in the row direction between the adjacent source lines SL.

In this embodiment, interconnections 51 in the dummy bit line regions and the plurality of interconnections 52 in the shunt region are partially electrically connected to each other by interconnections 53 of interconnection layer M0 which extend in the row direction. That is, interconnections 51 and the plurality of interconnections 52 which are arranged in parallel in the row direction are connected in parallel with the dummy bit lines D-BL via contacts. The shunt region is halved in the row direction, as indicated by broken line portions in FIG. 5. The plurality of interconnections 52 arranged on one side (upper side of FIG. 5) are connected in parallel with the dummy bit line D-BL together with interconnection 51 adjacent to one end. The plurality of interconnections 52 arranged on the other side (lower side of FIG. 5) are connected in parallel with the dummy bit line D-BL together with interconnection 51 adjacent to the other end. This allows the cells arranged in the shunt region and the dummy bit line regions to be connected to the bit lines (dummy bit lines D-BL) and function as memory cells.

Note that the plurality of interconnections 52 in the shunt region need not always be halved. The number of interconnections 52 connected in parallel on one side may be large, and the number of interconnections 52 connected in parallel on the other side may be small.

Figure 7:
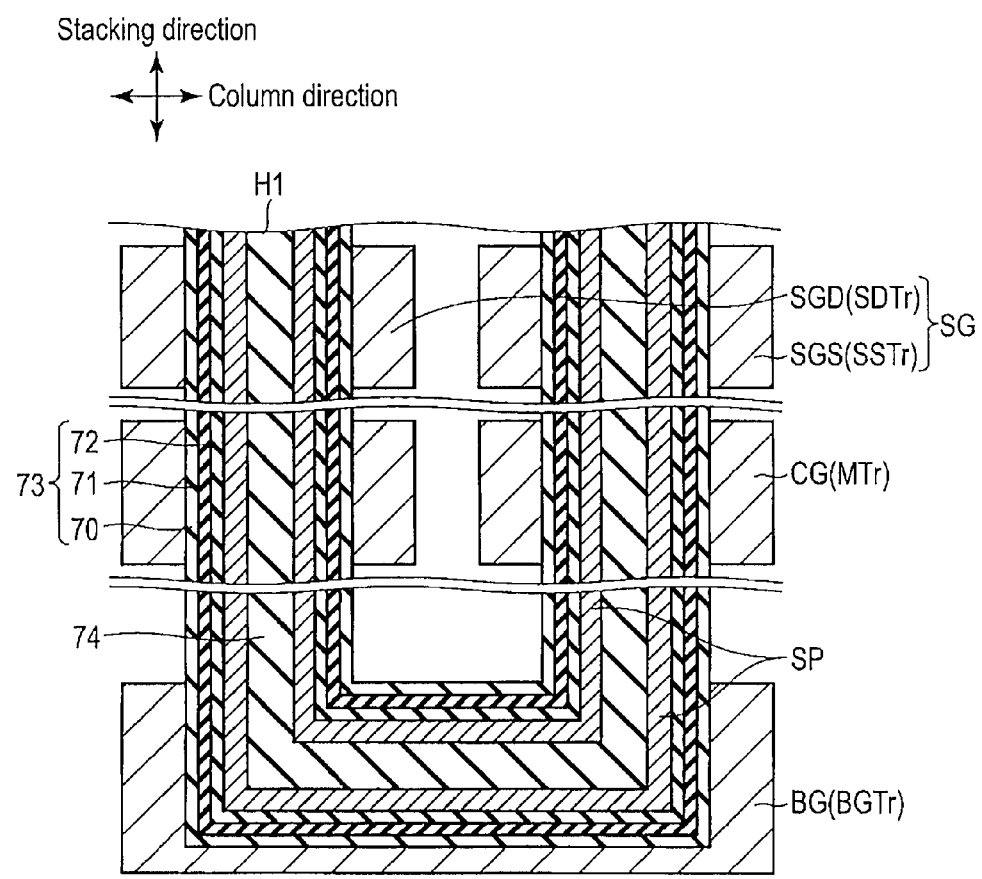
FIG. 7 is an enlarged sectional view of a memory string shown in FIG. 6.
Figure 9:
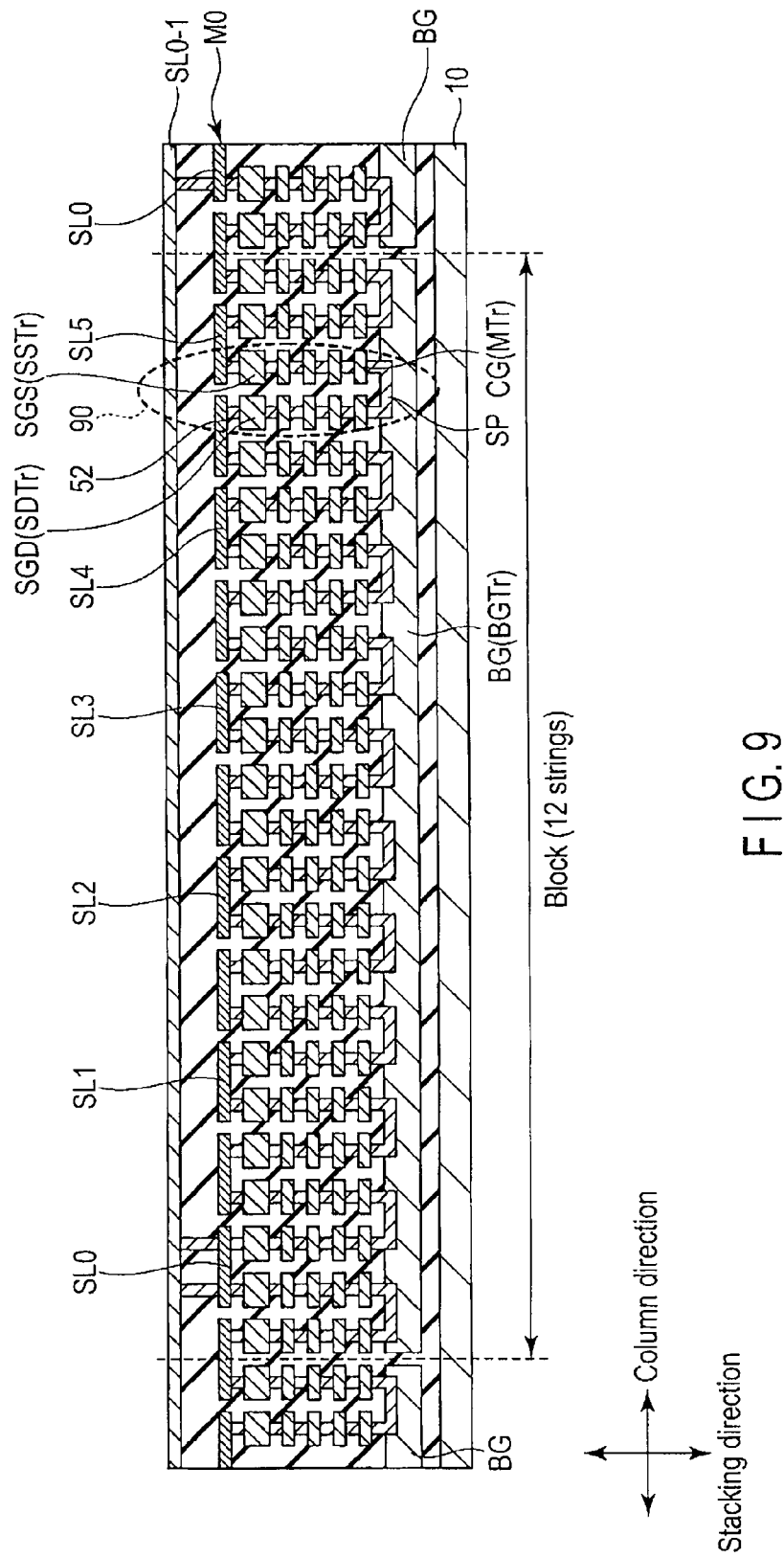
FIG. 9 is a sectional view taken along line IX-IX in FIGS. 4 and 5.
Figure 11:
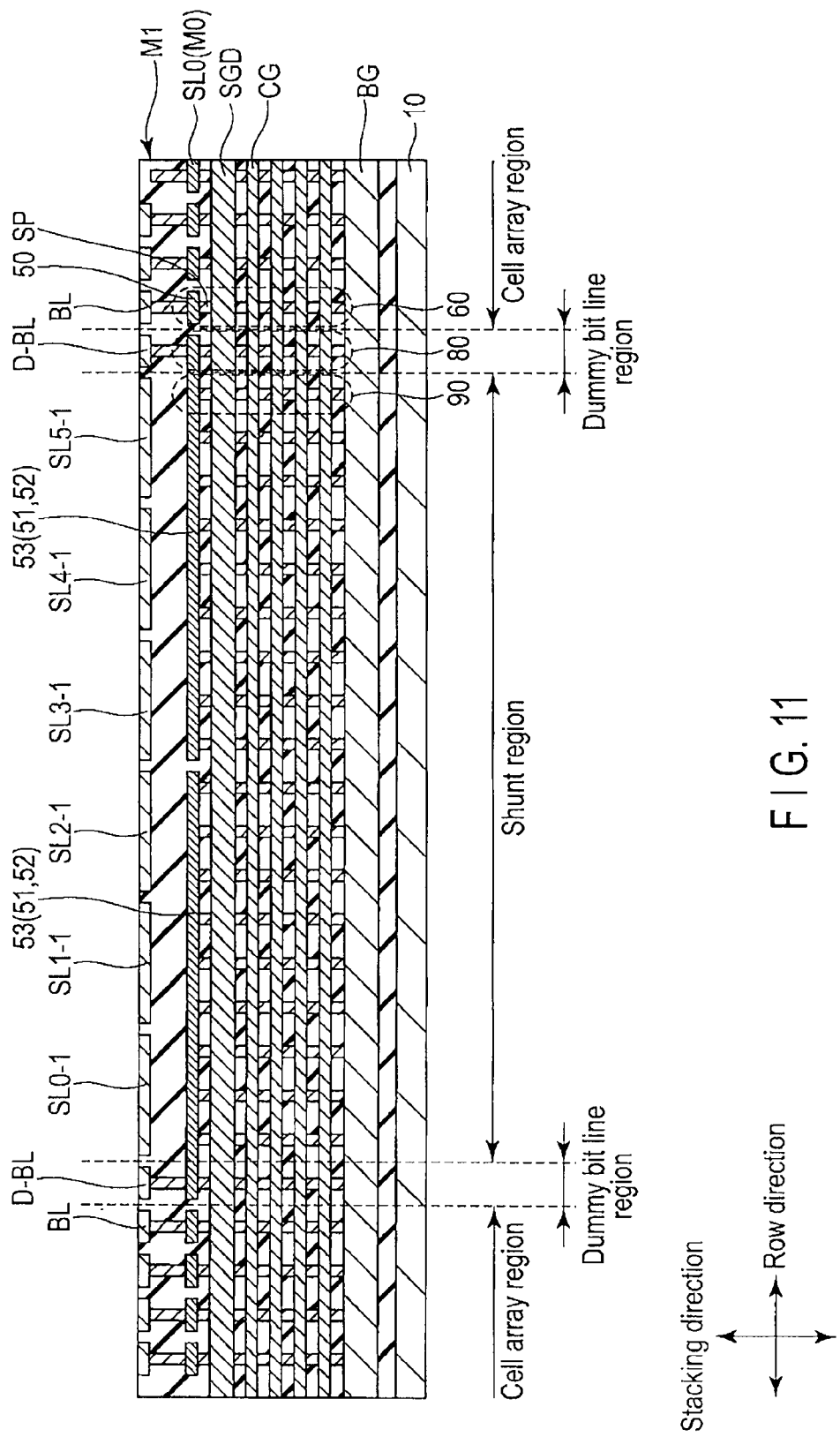
FIG. 11 is a sectional view taken along line XI-XI in FIGS. 4 and 5.

FIGS. 6, 7, 8, 9, 10, and 11 are sectional views showing the memory cell array 5 of the semiconductor memory device according to the first embodiment. More specifically, FIG. 6 is a sectional view taken along line VI-VI in FIGS. 4 and 5. FIG. 7 is an enlarged sectional view of a memory string. FIG. 8 is a sectional view taken along line VIII-VIII in FIGS. 4 and 5. FIG. 9 is a sectional view taken along line IX-IX in FIGS. 4 and 5. FIG. 10 is a sectional view taken along line X-X in FIGS. 4 and 5. FIG. 11 is a sectional view taken along line XI-XI in FIGS. 4 and 5. Note that FIGS. 6, 7, 8, 9, 10, and 11 mainly show interconnection layers M0 and M1 but do not illustrate interconnection layer M2.

As shown in FIG. 6, on the section of the cell array region along the column direction, a plurality of NAND strings (memory cell strings) 60 formed from U-shaped silicon pillars SP are formed on a substrate 10. Each memory string 60 includes a plurality of memory cell transistors MTr whose current paths are formed in series along the U-shaped silicon pillar SP, and two select transistors (a drain-side select transistor SDTr and a source-side select transistor SSTr) formed at the two ends.

The plurality of memory cell transistors MTr are formed at the intersections between the U-shaped silicon pillars SP and a plurality of control gates CG (word lines WL), and have the current paths connected in series along the stacking direction. As shown in FIG. 7, each memory cell transistor MTr has a memory film 73 between the U-shaped silicon pillar SP and the control gate CG. The memory film 73 includes a tunnel insulating film 72, a charge storage layer 71, and a block insulating film 70 which are sequentially formed around the U-shaped silicon pillar SP. That is, each memory cell transistor MTr has a MONOS structure.

The drain-side select transistor SDTr is formed at the intersection between the U-shaped silicon pillar SP and a drain-side select gate SGD. On the other hand, the source-side select transistor SSTr is formed at the intersection between the U-shaped silicon pillar SP and a source-side select gate SGS. As shown in FIG. 7, each of the drain-side select transistor SDTr and the source-side select transistor SSTr has the MONOS structure, like the memory cell transistor MTr.

The drain-side select transistor SDTr and the source-side select transistor SSTr are formed above the plurality of memory cell transistors MTr. The source-side select transistor SSTr has one terminal connected to one terminal of the plurality of memory cell transistors MTr and the other terminal connected to the source line SL. The drain-side select transistor SDTr has one terminal connected to the other terminal of the plurality of memory cell transistors MTr and the other terminal connected to the bit line BL via interconnection 50. As described above, the source lines SL and interconnections 50 are on the same level and are located in interconnection layer M0.

The U-shaped silicon pillar SP is formed into a U shape along the section in the column direction. The U-shaped silicon pillar SP includes a pair of columnar portions extending in the stacking direction and a connection portion formed to connect the lower ends of the pair of columnar portions. The connection portion is provided in a back gate BG to form a back gate transistor BGTr. The U-shaped silicon pillar SF is arranged such that the line connecting the central axes of the pair of columnar portions becomes parallel to the column direction. The U-shaped silicon pillars SP are arranged in a matrix within a row- and column-direction plane. As shown in FIG. 7, the U-shaped silicon pillar SP has a hollow H1 which is filled with an insulating portion 74.

The plurality of control gates CG are stacked above the back gate BG and arranged to be perpendicular to the columnar portions of the U-shaped silicon pillars SP. The control gates CG extend in parallel in the row direction. The plurality of control gates CG are isolated from each other for each columnar portion of the U-shaped silicon pillars SP in the column direction with a line-and-space configuration. That is, each control gate CG is formed to be shared by the columnar portions of the silicon pillars SP arranged in the row direction.

Note that although FIG. 6 illustrates an example in which four layers of control gates CG are stacked, the present embodiment is not limited to this. Additionally, although not illustrated, the odd-numbered control gates CG in the column direction group at one end of each block (for example, 12 memory strings) in the row direction. On the other hand, the even-numbered control gates CG in the column direction group at the other end of each block in the row direction.

The back gate BG is provided under the lowermost control gates CG. The back gate BG is formed to two-dimensionally spread in the row direction and the column direction so as to cover the connection portions of the U-shaped silicon pillars SP.

The drain-side select gates SGD and the source-side select gates SGS are provided above the uppermost control gates CG. The drain-side select gates SGD and the source-side select gates SGS extend in parallel in the row direction. The drain-side select gates SGD and the source-side select gates SGS are formed to intersect the columnar portions of the U-shaped silicon pillars SP, and isolated from each other in the column direction with a line-and-space configuration.

The source lines SL are provided in interconnection layer M0 above the source-side select gates SGS and connected to one terminal of each source-side select transistor SSTr. Each source line SL is formed to be shared by two adjacent columnar portions of the U-shaped silicon pillars SP in two memory strings 60 adjacent in the column direction. The plurality of source lines SL extend in the row direction and are isolated from each other in the column direction with a line-and-space configuration. That is, each source line extends in the row direction while being connected to one of the pair of connection portions of the silicon pillar SP, and is formed above memory string 60 of the silicon pillar SP.

The bit lines BL are provided in interconnection layer M1 above the source lines SL. The bit lines BL are connected to one terminal of each drain-side select transistor SDTr via interconnections 50. The plurality of bit lines BL extend in the column direction and are isolated from each other in the row direction with a line-and-space configuration.

Interconnections 50 are provided above memory strings 60 of the silicon pillars SP, that is, on the same level (interconnection layer M0) as that of the source lines SL. Each interconnection 50 is formed to be shared by two adjacent columnar portions of the U-shaped silicon pillars SP in two memory strings 60 adjacent in the column direction. Interconnections 50 are arranged between the adjacent source lines SL in the column direction. Interconnections 50 are arranged at the same positions as those of the bit lines BL in the row direction. In other words, the plurality of interconnections 50 are isolated from each other in the row direction with a line-and-space configuration.

As shown in FIG. 8, on the section of the dummy bit line region along the column direction, a plurality of memory strings (memory cell strings) 80 formed from the U-shaped silicon pillars SP are formed on the substrate 10. Each memory string 80 has the same structure as that of memory string 60 shown in FIG. 6.

That is, each memory string 80 includes a plurality of memory cell transistors MTr whose current paths are formed in series along the U-shaped silicon pillar SP, and two select transistors (the drain-side select transistor SDTr and the source-side select transistor SSTr) formed at the two ends. This is because memory strings 80 in the dummy bit line region are formed simultaneously together with memory strings 60 in the cell array regions in the step of manufacturing the cells.

The dummy bit lines D-BL are provided in interconnection layer M1 above the source lines SL. The dummy bit line D-BL is connected to one terminal of each drain-side select transistor SDTr via interconnection 51.

Interconnections 51 are provided above memory strings 80 of the silicon pillars SP, that is, on the same level (interconnection layer M0) as that of the source lines SL. Each interconnection 51 is formed to be shared by two adjacent columnar portions of the U-shaped silicon pillars SP in two memory strings 80 adjacent in the column direction. Interconnections 51 are arranged between the adjacent source lines SL in the column direction. In other words, interconnections 51 are arranged at the same positions as those of interconnections 50 in the column direction. In addition, interconnections 51 are arranged at the same positions as those of the dummy bit line D-BL in the row direction.

As shown in FIG. 9, on the section of the shunt region along the column direction, a plurality of memory strings (memory cell strings) 90 formed from the U-shaped silicon pillars SP are formed on the substrate 10. Each memory string 90 has the same structure as that of memory string 60 shown in FIG. 6 and memory string 80 shown in FIG. 8.

That is, each memory string 90 includes a plurality of memory cell transistors MTr whose current paths are formed in series along the U-shaped silicon pillar SP, and two select transistors (the drain-side select transistor SDTr and the source-side select transistor SSTr) formed at the two ends. This is because memory strings 90 in the shunt region are formed simultaneously together with memory strings 60 in the cell array regions and memory strings 80 in the dummy bit line regions in the step of manufacturing the cells.

Interconnections 52 are provided above memory strings 90 of the silicon pillars SP, that is, on the same level (interconnection layer M0) as that of the source lines SL. Each interconnection 52 is formed to be shared by two adjacent columnar portions of the U-shaped silicon pillars SP in two memory strings 90 adjacent in the column direction. Interconnections 52 are arranged between the adjacent source lines SL in the column direction. In other words, interconnections 52 are arranged at the same positions as those of interconnections 50 and 51 in the column direction. In addition, interconnections 52 are arranged under source interconnections SL-1.

As shown in FIGS. 10 and 11, on the sections along the row direction, the control gates CG, the drain-side select gates SGD, and the source-side select gates SGS are formed to extend through the cell array regions, the dummy bit line regions, and the shunt region. As shown in FIG. 10, source line SL0 of interconnection layer M0 is connected to source interconnection SL0-1 of interconnection layer M1 via contacts. Although not illustrated, source lines SL1 to SL5 are also connected to source interconnections SL1-1 to SL5-1 via contacts, respectively.

As shown in FIG. 11, in the first embodiment, interconnections 51 (interconnection layer M0) in the dummy bit line regions are connected to the dummy bit lines D-BL (interconnection layer M1) via contacts. Interconnections 51 are also connected to the plurality of interconnections 52 (interconnection layer M0) of the same level in the shunt region via interconnections 53 (interconnection layer M0) of the same level. That is, memory strings 80 in the dummy bit line regions and the plurality of memory strings 90 in the shunt region are connected in parallel with the dummy bit lines D-BL.

The plurality of memory strings 90 in the shunt region which are arranged in parallel in the row direction are halved. The plurality of memory strings 90 arranged on one side (right side of FIG. 11) are connected in parallel with the dummy bit line D-BL together with memory string 80 in the dummy bit line region adjacent to one end. The plurality of memory strings 90 arranged on the other side (left side of FIG. 11) are connected in parallel with the dummy bit line D-BL together with memory string 80 in the dummy bit line region adjacent to the other end. This makes it possible to ensure a memory having a storage capacity of one bit by memory string 80 and memory strings 90 connected in parallel on one side in the row direction or memory string 80 and memory strings 90 connected in parallel on the other side.

According to the first embodiment, memory string 80 in the dummy bit line region is connected to the dummy bit line D-BL via a contact and also connected to the plurality of memory strings 90 in the shunt region via interconnection layer M0 (interconnections 51, 52, and 53). This makes it possible to connect memory string 80 in the dummy bit line region and memory strings 90 in the shunt region to the dummy bit line D-BL and make them function as a memory such as a ROM fuse. In this way, the storage capacity can apparently be increased by effectively using memory string 80 in the dummy bit line region and memory strings 90 in the shunt region. It is also possible to reduce the memory area normally used as a ROM fuse and thus reduce the chip area.

In interconnection layer M0, interconnections 51 connected to memory string 80 and the plurality of interconnections 52 connected to memory strings 90 are connected in parallel by interconnection 53. This makes it possible to connect memory string 80 and the plurality of memory strings 90 in parallel and increase the number of cells (cell capacity). As a result, even when the reliability of a single memory string is low, the cell current that changes depending on the threshold can be increased by connecting the plurality of memory strings in parallel. That is, it is possible to ensure reliable memories in the dummy bit line regions and the shunt region.

<Second Embodiment>

A semiconductor memory device according to the second embodiment will be described below with reference to FIGS. 12 and 13. In the first embodiment, the plurality of memory cell strings arranged in parallel along the row direction in the shunt region are halved and connected in parallel by interconnection 53, thereby ensuring a region for storing one-bit data. In the second embodiment, all the plurality of memory cell strings arranged in parallel along the row direction in the shunt region are connected in parallel by interconnections 53.

Note that in the second embodiment, a description of the same points as in the first embodiment will be omitted, and different points will be explained.

Figure 12:
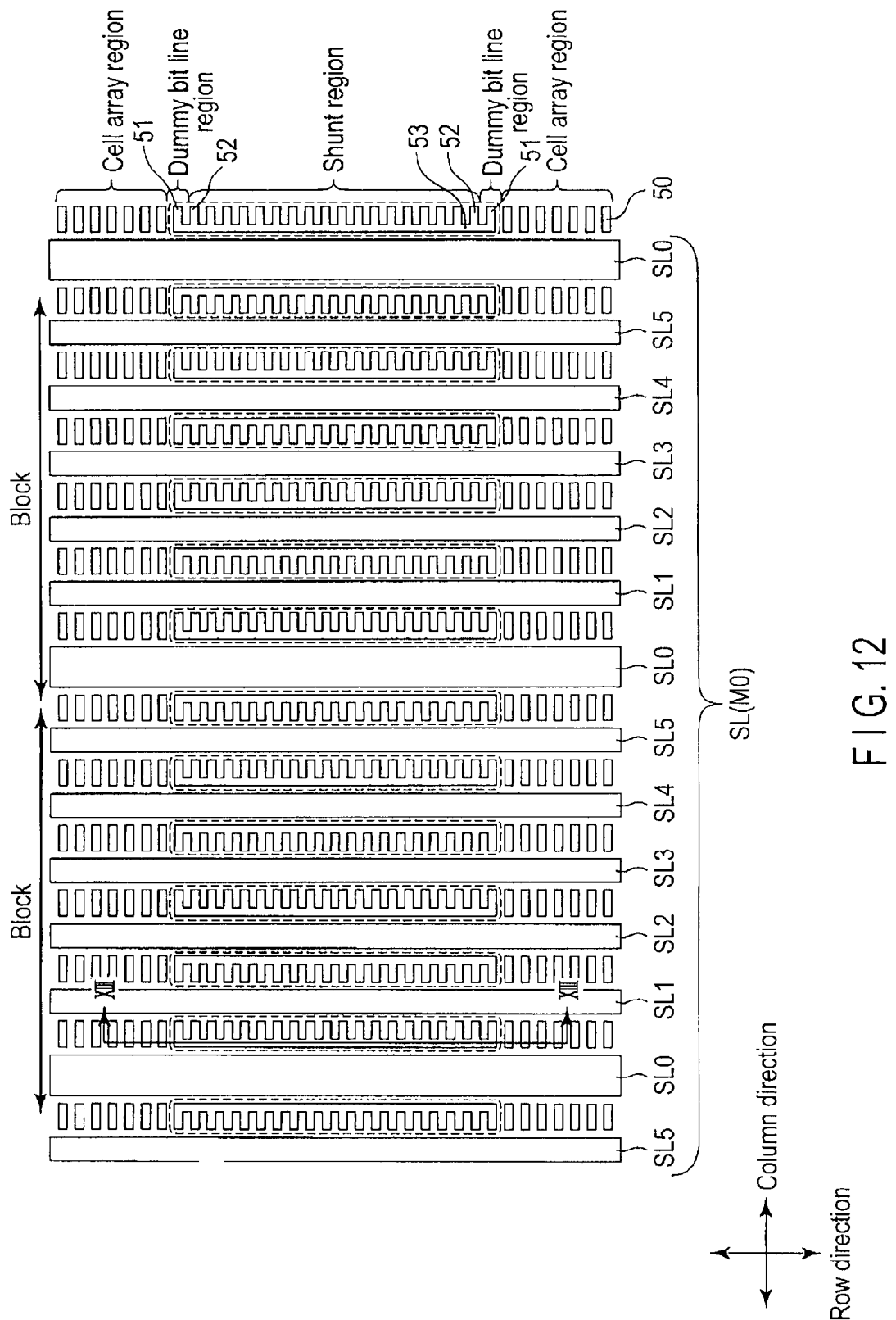
FIG. 12 is a plan view showing the memory cell array of a semiconductor memory device according to the second embodiment.

FIG. 12 is a plan view showing a memory cell array 5 of the semiconductor memory device according to the second embodiment. More specifically, FIG. 12 is a plan view showing a lower interconnection layer M0.

As shown in FIG. 12, interconnections 51 of interconnection layer M0 are formed in the dummy bit line regions and arranged between source lines SL in the column direction. The plurality of interconnections 51 are arranged under dummy bit lines D-BL.

A plurality of interconnections 52 of interconnection layer M0 are formed in the shunt region and arranged between the source lines SL in the column direction. The plurality of interconnections 52 are formed with a line-and-space configuration in the row direction.

Interconnections 50 in the cell array regions, interconnections 51 in the dummy bit line regions, and interconnections 52 in the shunt region are formed in parallel in the row direction between the adjacent source lines SL.

As indicated by broken line portions in FIG. 12, in the second embodiment, all of the plurality of interconnections 52 in the shunt region, which are arranged in parallel in the row direction between the adjacent source lines SL, are partially electrically connected to each other by interconnections 53 of interconnection layer M0 which extend in the row direction. In addition, interconnections 51 adjacent in the row direction to the both ends of the plurality of interconnections 52 in the shunt region are also electrically connected. That is, all interconnections 51 and 52 which are arranged in parallel in the row direction are connected in parallel with the dummy bit lines D-BL via contacts at both ends. This allows the cells arranged in the shunt region and the dummy bit line regions to be connected to the bit lines (dummy bit lines D-BL) and function as memory cells, as will be described later.

Figure 13:
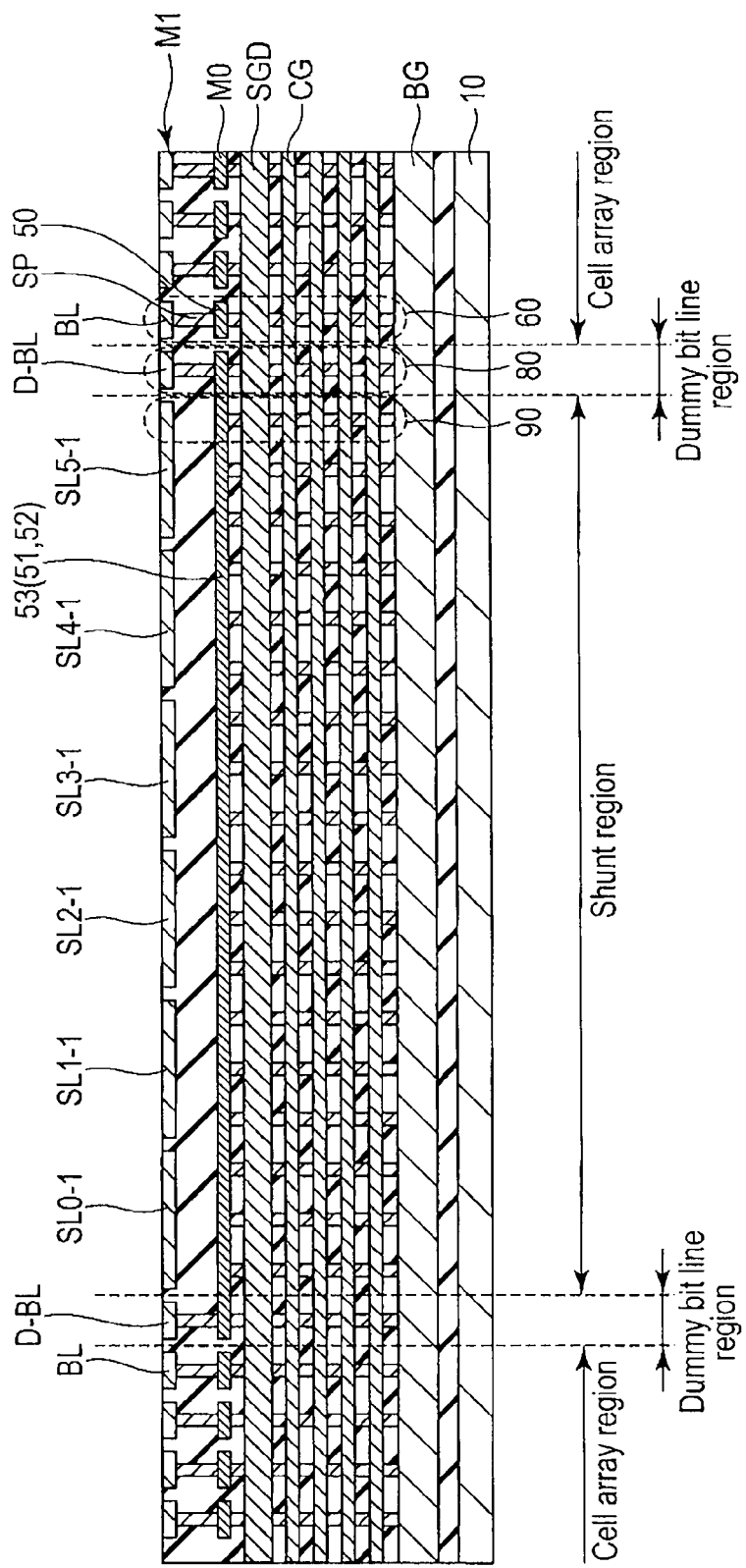
FIG. 13 is a sectional view taken along line XIII-XIII in FIG. 12.

FIG. 13 is a sectional view showing the memory cell array 5 of the semiconductor memory device according to the second embodiment. More specifically, FIG. 13 is a sectional view taken along line XIII-XIII in FIG. 12. Note that FIG. 13 mainly shows interconnection layers M0 and M1 but does not illustrate an interconnection layer M2.

As shown in FIG. 13, interconnections 51 (interconnection layer M0) in the dummy bit line regions are connected to the dummy bit lines D-BL (interconnection layer M1) via contacts. Interconnections 51 are also connected to the plurality of interconnections 52 (interconnection layer M0) of the same level in the shunt region via interconnections 53 (interconnection layer M0) of the same level. That is, memory strings 80 in the dummy bit line regions and a plurality of memory strings 90 in the shunt region are connected in parallel with the dummy bit lines D-BL.

All of the plurality of memory strings 90 in the shunt region which are arranged in parallel in the row direction are connected in parallel with the dummy bit lines D-BL together with memory strings 80 adjacent to both ends (left and right sides of FIG. 13). This makes it possible to ensure a memory having a storage capacity of one bit by memory strings 80 and memory strings 90 connected in parallel in the row direction.

According to the second embodiment, the same effects as in the first embodiment can be obtained.

Additionally, in the second embodiment, all interconnections 51 and 52 arranged in parallel in the row direction between the adjacent source lines SL are connected in parallel with the dummy bit lines D-BL. This makes it possible to increase the number of cells (cell capacity) connected in parallel with the dummy bit lines D-BL more than in the first embodiment. As a result, it is possible to ensure reliable memories in the dummy bit line regions and the shunt region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first cell array region;
a second cell array region arranged in a row direction;
a shunt region arranged between the first cell array region and the second cell array region;
a first dummy bit line region arranged between the first cell array region and the shunt region;
a second dummy bit line region arranged between the second cell array region and the shunt region;
a first silicon pillar including a first pair of columnar portions and a first connection portion in the first dummy bit line region, each of the first columnar portions extending vertically with respect to a semiconductor substrate, the first connection portion connecting lower ends of the first pair of columnar portions;
a second silicon pillar including a second pair of columnar portions and a second connection portion in the shunt region, each of the second columnar portions extending vertically with respect to the semiconductor substrate, the second connection portion connecting lower ends of the second pair of columnar portions, the second silicon pillar being adjacent to the first silicon pillar in the row direction;
a source line connected to one of the pair of columnar portions of each of the first silicon pillar and the second silicon pillar;
a first interconnection connected to the other of the first pair of columnar portions of the first silicon pillar, the first interconnection formed above the first silicon pillar on the same level as that of the source line;
a second interconnection connected to the other of the second pair of columnar portions of the second silicon pillar, the second interconnection formed above the second silicon pillar on the same level as that of the source line; and
a first dummy bit line connected to the first interconnection, the first dummy bit line formed above the first interconnection,
wherein the first interconnection and the second interconnection are connected on the same level.

2. The device of claim 1, wherein the first interconnection and the second interconnection are connected in parallel with each other.

3. The device of claim 1, further comprising:
a third silicon pillar including a third pair of columnar portions and a third connection portion in the shunt region, each of the third columnar portions extending vertically with respect to the semiconductor substrate, the third connection portion connecting lower ends of the third pair of columnar portions, the third silicon pillar having one of the third pair of columnar portions connected to the source line above the third memory string and being adjacent to the second silicon pillar on a side different from the first silicon pillar in the row direction; and a third interconnection connected to the other of the third pair of columnar portions of the third silicon pillar, the third interconnection formed above the third silicon pillar on the same level as that of the source line,
wherein the third interconnection is connected to the first interconnection and the second interconnection.

4. The device of claim 1, further comprising:
a third silicon pillar including a third pair of columnar portions and a third connection portion in the second dummy bit line region, each of the third columnar portions extending vertically with respect to the semiconductor substrate, the third connection portion connecting lower ends of the third pair of columnar portions, the third silicon pillar having one of the third pair of columnar portions connected to the source line above the third memory string;
a fourth silicon pillar including a fourth pair of columnar portions and a fourth connection portion in the shunt region, each of the fourth columnar portions extending vertically with respect to the semiconductor substrate, the fourth connection portion connecting lower ends of the fourth pair of columnar portions, the fourth silicon pillar having one of the fourth pair of columnar portions connected to the source line above the fourth silicon pillar and being adjacent to the third silicon pillar in the row direction;
a third interconnection connected to the other of the third pair of columnar portions of the third silicon pillar, the third interconnection formed above the third silicon pillar on the same level as that of the source line,
a fourth interconnection connected to the other of the fourth pair of columnar portions of the fourth silicon pillar, the fourth interconnection formed above the fourth silicon pillar on the same level as that of the source line,
wherein the third interconnection is connected to a second dummy bit line formed above the third interconnection and extending in the column direction, and
the third interconnection and the fourth interconnection are connected on the same level.

5. The device of claim 4, wherein the first interconnection and the second interconnection are connected in parallel with each other, and the third interconnection and the fourth interconnection are connected in parallel with each other.

6. The device of claim 4, wherein the first interconnection and the second interconnection are isolated from the third interconnection and the fourth interconnection.

7. The device of claim 5, wherein the first interconnection, the second interconnection, the third interconnection, and the fourth interconnection are connected in parallel with each other.

8. The device of claim 1, wherein the first silicon pillar forms a first memory string having current paths formed in series along the pair of columnar portions and the connection portion.

9. The device of claim 1, wherein the second silicon pillar forms a second memory string having current paths formed in series along the pair of columnar portions and the connection portion.

10. The device of claim 1, wherein a first memory string and a second memory string are used as a ROM fuse to store management data.

11. The device of claim 1, further comprising a control circuit configured to apply a voltage to the first dummy bit line in write, read, and erase operations.

12. The device of claim 10, wherein the first memory string and the second memory string have a storage capacity of one bit.

13. The device of claim 10, wherein each of the first memory string and the second memory string and a pair including a third memory string and a fourth memory string has a storage capacity of one bit.

14. The device of claim 8, wherein the first memory string includes a tunnel insulating film, a charge storage layer, a block insulating film, and a word line that are sequentially formed around the first silicon pillar.

15. The device of claim 9, wherein the second memory string includes a tunnel insulating film, a charge storage layer, a block insulating film, and a word line that are sequentially formed around the second silicon pillar.

16. The device of claim 8, wherein the first memory string includes memory cell transistors and whose current paths are formed in series along the first silicon pillar, and two select transistors formed at the two ends of the memory cell transistors.

17. The device of claim 1, wherein the first interconnection and the second interconnection are connected on the same level via a third interconnection.

\* \* \* \* \*